United States Patent [19]
Combs et al.

[11] Patent Number: 5,638,004
[45] Date of Patent: Jun. 10, 1997

[54] MULTICONDUCTOR CONTINUITY AND INTERMITTENT FAULT ANALYZER WITH DYNAMIC STIMULATION

[75] Inventors: Gary L. Combs, Seabeck; Ronald J. Battles, Silverdale; Dennis F. Frey, Keyport; John H. Holman, Poulsbo; John G. Miskimins, Port Hadlock, all of Wash.

[73] Assignee: The United States of America as represented by the Secretary of the Navy, Washington, D.C.

[21] Appl. No.: 442,616

[22] Filed: May 16, 1995

[51] Int. Cl.$^6$ ................................................ G01R 31/08
[52] U.S. Cl. ................................................ 324/539; 324/66
[58] Field of Search ........................... 324/66, 538, 539, 324/540, 513, 527

[56] References Cited

U.S. PATENT DOCUMENTS

| | | | |
|---|---|---|---|
| 1,487,298 | 3/1924 | Vennes | 324/513 |
| 1,882,815 | 10/1932 | Haegele et al. | 324/513 |
| 1,967,296 | 7/1934 | Dixon et al. | 324/513 |
| 2,494,595 | 1/1950 | Taylor et al. | 324/513 |
| 2,586,125 | 2/1952 | Blarcom | 324/513 |
| 3,609,535 | 9/1971 | Paine | 324/513 |
| 4,224,690 | 9/1980 | Rockwell | 371/25 |
| 4,772,845 | 9/1988 | Scott | 324/66 |
| 5,029,274 | 7/1991 | Goff et al. | 324/66 |
| 5,228,042 | 7/1993 | Gauthier et al. | 371/20.5 |
| 5,237,282 | 8/1993 | Boivin | 324/539 |
| 5,247,259 | 9/1993 | Miller et al. | 324/540 |
| 5,280,251 | 1/1994 | Strangio | 324/539 |

*Primary Examiner*—Sandra L. O'Shea
*Assistant Examiner*—Raymond Y. Mah
*Attorney, Agent, or Firm*—William C. Townsend; Kenneth W. Dobyns; Edward J. Connors, Jr.

[57] ABSTRACT

A multiconductor continuity and intermittent fault analysis system that subjects the cable to controlled environmental stress stimuli, such a vibration at controlled frequencies, during testing. Multiconductor cables used for the transmission of digital data and control signals include multiple individual conductors terminating at both ends in pins or sockets that are grouped together in a connector. Physical defects in these cables can be permanent, or they can be intermittent faults, such as temporary breaks or shorts caused by vibrational stress on the cables. By vibrating the cable under test and measuring continuity rapidly enough to detect short-term anomalies, even intermittent faults are located.

11 Claims, 12 Drawing Sheets

MULTICONDUCTOR CONTINUITY AND INTERMITTENT FAULT ANALYZER WITH DYNAMIC STIMULATION

BACKGROUND OF THE INVENTION

This invention relates generally to multiconductor continuity and intermittent fault analysis systems, and more particularly to multiconductor cable testers that subject the cable to controlled environmental stress stimuli during testing.

Multiconductor cables are widely used for the transmission of digital data and control signals. In general, the cables include multiple individual conductors terminating at both ends in pins or sockets that are grouped together in a connector. As digital control systems have become more common, multiconductor cables have become more varied. Modern multiconductor cables are found in a very large variety of connector shapes and sizes, number of conductors, and internal wiring schemes. Examples range from small ribbon cables used in personal computers that may have only a few conductors to massive cable harnesses used in aircraft control systems that may have hundreds or thousands of individual conductors.

As the complexity of the cable wiring schemes has increased, so too has the variety of cable testing equipment. Most conventional testing devices focus on determining the continuity paths between the individual pins of the cable. Determining the continuity paths serves two purposes: (1) identifying the internal wiring of the cable; and (2) detecting faults or defects in the cable. In general, conventional testing systems check continuity by applying a test signal to one or more test pins at one end of the cable and searching the remaining pins at both ends of the cable for the presence of the applied signal. If any of the remaining pins receives the test signal, that indicates a continuity path between that pin and the test pin.

The most sophisticated systems are capable of quickly determining complex wiring arrangements, cross-checking the continuity results against the wiring schematic stored in memory, and saving, displaying, or printing the test results for future comparison or record keeping purposes. If the signal is not received at the appropriate pins, an open circuit condition (open) is indicated, while the presence of the signal on pins where there should be no signal indicates a short circuit condition (short).

These faults can result from any number of physical defects or manufacturing errors including broken wires, incorrect pin fit, deformed pins, missing springs, cold solder joints, and bad crimps. Moreover, these defects manifest themselves in two different forms of faults: (1) hard faults, which are permanent or long-lasting opens or shorts; and (2) intermittent faults, which are opens or shorts that may last only microseconds or milliseconds.

Conventional systems are not capable of detecting intermittent faults, i.e. opens or shorts lasting only a few microseconds or milliseconds. Intermittent faults are generally caused by the same types of problems that lead to hard faults, but in a less severe form. For example, although a conductor may be cracked or broken at a given point, the severed ends of the conductor may usually remain in contact with one another, breaking contact only periodically, and for a very short time, constituting therefore an intermittent fault.

The only way conventional systems could detect such a short-lived fault is if the fault occurred exactly when that pin or conductor was being tested, and for long enough to be detected by the system. As a result, many cables that pass conventional continuity analysis may actually have multiple defects that lead to intermittent faults when the cable is placed into operation, particularly under harsh ambient conditions. In fact, recent information indicates that intermittent faults in multiconductor cables form one of the most common and significant sources of error in digital control systems.

Accordingly, conventional multiconductor cable systems and testing techniques must be modified to detect intermittent faults. This modification must be twofold: first, intermittent faults must be induced or generated in the cable during the testing procedure; and second, the testing system must be capable of detecting the intermittent faults when they occur.

Both modifications of the conventional system must be present to ensure accurate fault detection. For example, even if intermittent faults were being generated during testing, many conventional systems would not be capable of detecting a fault lasting only a few microseconds or milliseconds. Likewise, those systems that might be fast enough to detect intermittent faults would not be able to do so if the faults were not being induced at the precise moment when the individual pin or conductor connected to that fault were being tested.

FIELD OF THE INVENTION

The present invention provides a high-speed digital cable tester that can run a simple continuity test, reduce test time, manifest and detect short-duration faults (opens and shorts) in cables, reproduce test results in the same cable, locate the pin or pins in a connector that produced faults, operate at the simplest test level without causing degradation to the cable under test, and operate at the lowest possible cost.

The invention provides an improved multiconductor cable testing system that overcomes the disadvantages associated with the prior art. The invention provides an improved cable testing system that reliably induces intermittent faults in the cable under test of the sort that might occur when the cable is placed into its intended operating environment. The invention provides an improved cable testing system that determines the continuity paths of the cable and also detects intermittent faults lasting only a few microseconds or milliseconds. The invention accomplishes the foregoing with a multiconductor cable-continuity and intermittent-fault analysis system that is compatible with existing cables, is expandable to accommodate future cable designs, and is portable, small, and inexpensive.

DETAILED DESCRIPTION OF THE PREFERRED EMBODIMENT

Figure 1:
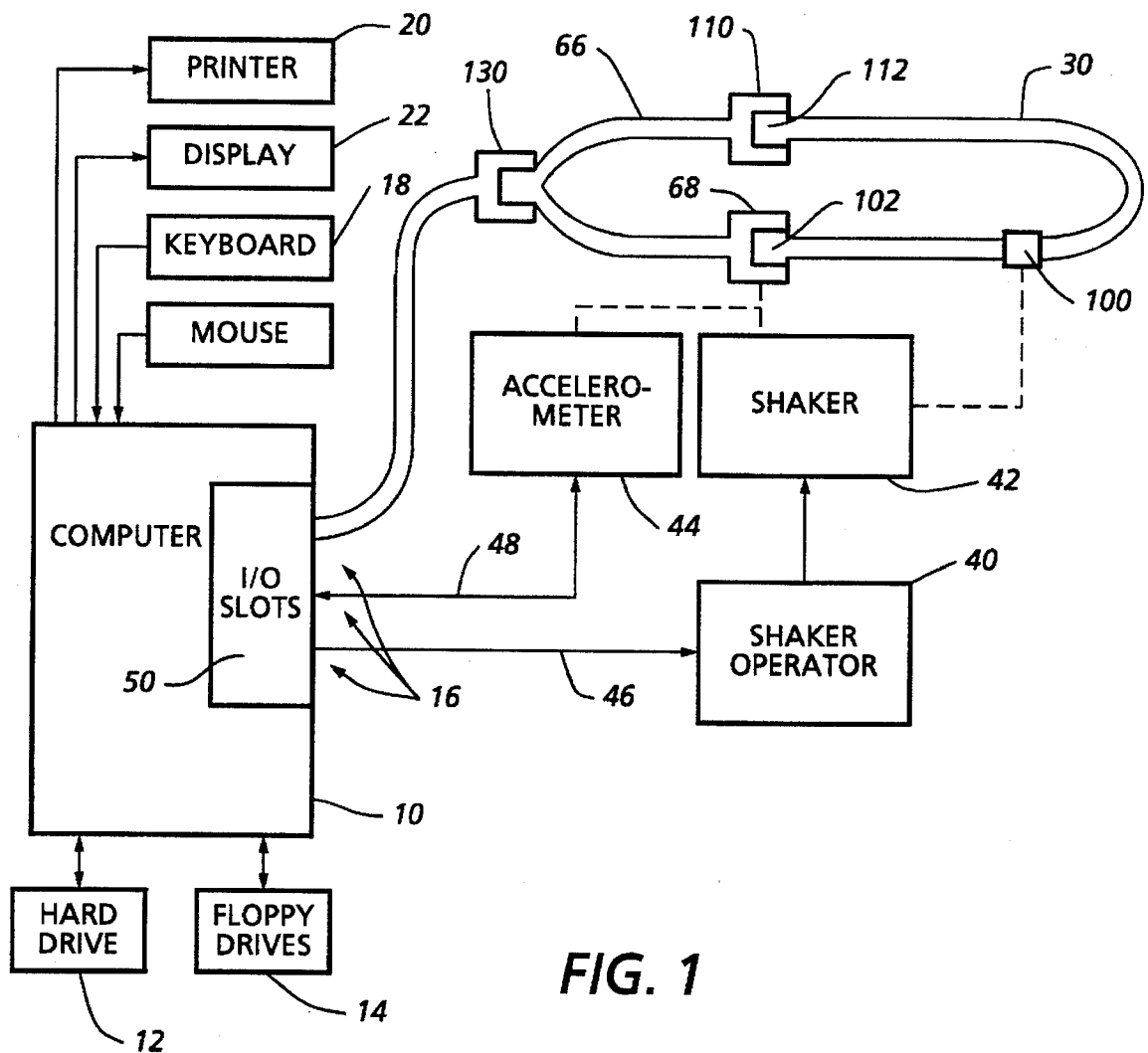
FIG. 1 is a block diagram of a preferred embodiment of the system.

A block diagram showing the preferred embodiment of the invention is provided in FIG. 1. The system is designed around a standard microprocessor controlled personal computer 10 or effectively equivalent circuitry. It is equipped as standard peripheral equipment with a hard drive 12, floppy diskette drives 14, input/output (I/O) ports 16, a keyboard 18, a printer 20, and a display monitor 22.

There are two main subsystems of the invention—a signal processing subsystem and a dynamic stimulation subsystem, which operate independently of one another. However, since each subsystem is controlled by a separate software program, the PC must be equipped with an operating system capable of managing at least two processes simultaneously. For example, the preferred embodiment uses the OS/2 WARP operating system, available from IBM. A math coprocessor is recommended.

The signal processing subsystem is responsible for transmitting test signals through individual pins and conductors of the cable under test (CUT) 30, determining the continuity paths between the pins, counting intermittent faults, saving the test results to a data file, and displaying or printing the results. The dynamic stimulation subsystem uses a closed-loop control scheme to manage a shaker operator 40, which controls a hydraulic shaker 42 on which the CUT is mounted. Vibrations generated by the shaker are specifically tailored to induce intermittent faults without damaging the CUT.

The main function of the dynamic stimulus is to induce intermittent faults by vibrating the components of the CUT. In principle, the vibration energy will cause the individual components of the CUT to move sufficiently to activate existing. intermittent opens or shorts without causing damage to a good cable.

It is desirable that the measurement of the faults in an individual conductor in the cable can be completed in less than a half cycle of the period of the highest effective frequency of the mechanical vibrations applied to the CUT. It is more desirable by an order of magnitude that such a measurement can be made for all of the individual conductors in the cable during one such half-cycle period. This is determined by a combination of the clock-pulse frequency of the computer and the vibration frequency of the shaker.

Figure 2:
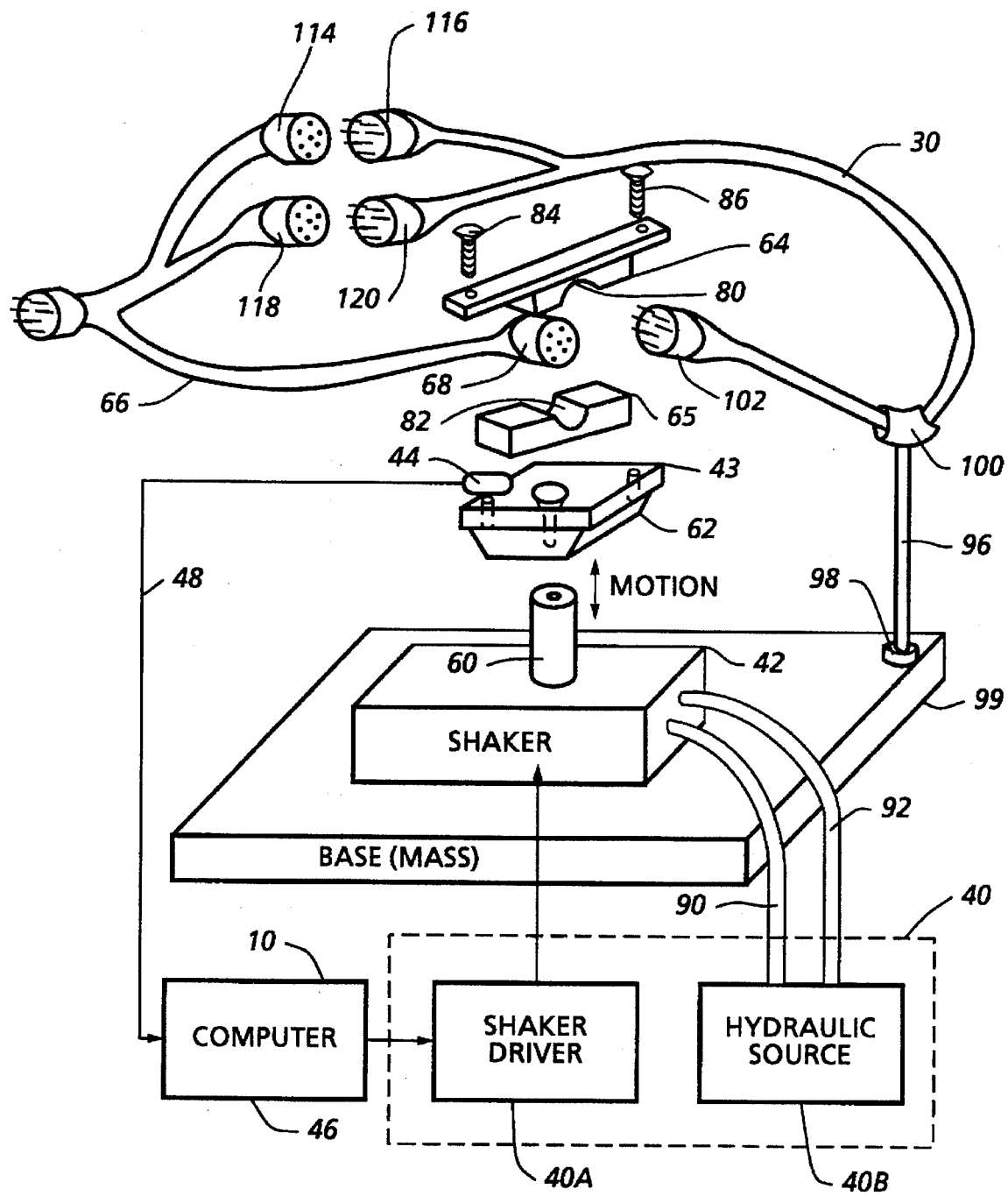
FIG. 2 is a schematic diagram showing in more detail the equipment for mechanically inducing intermittent faults in the continuity of the cable.

As shown in FIG. 2, the main hardware components of the dynamic stimulation subsystem include a shaker operator 40 which operates a hydraulic shaker 42 to vibrate a test fixture 43. The operator includes a shaker driver 40A and a hydraulic source 40B. The shaker driver receives via line 46 signals from the vibration controller program running on the computer 10, and uses those commands to control a valve in the shaker 42 the regulates the flow of the hydraulic fluid provided by the hydraulic source 40B.

Mounted on the test fixture, in addition to the cable 30 under test, is an accelerometer 44. The system is controlled by a software program loaded into the memory of computer 10, which sends control signals via line 46 to the shaker driver 40A, and receives feedback signals via line 48 from accelerometer 44, and via an I/O card in the I/O interface slots 50 (FIG. 1).

The cable test fixture 43 is mounted on the hydraulic shaker's actuator piston 60 and includes a base portion 62 and a clamp portion 64, 65. The cable under test (CUT) 30 is connected to an adaptor cable 66 for communication with the signal processing subsystem. A connector 68 of the adaptor cable 66 is secured in the test fixture 43, thus transmitting the vibration energy from the shaker to the CUT 30. This is at least partially analogous to the cable being plugged into a socket when in actual use under field conditions.

The clamp portion is comprised of two main pieces 64 and 65, containing notches 80 and 82, respectively, for receiving the connector 68. The lower piece 65 rests on the base portion 62 of the test fixture and receives the adaptor cable connector 68 into notch 82. The notch 80 in the upper portion 64 fits over the upper surface of the connector 68. The top portion of the clamp is then secured to the base 62 of the test fixture by threading bolts 84 and 86 through the threaded holes provided in base 62. Tightening the bolts presses the upper portion 64 of the clamp firmly onto the connector 68, which holds the connector against the lower portion 65 of the clamp, and which also forces the lower portion 65 firmly against the base of the fixture. Any cable connector shape or size can be accommodated by modifying the notches 80 and 82 in the clamp.

In the preferred embodiment the hydraulic shaker system 42 provides 1000 force-pounds for sine wave oscillations up to 3000 Hz, and is available from TEAM Corporation. For the typical multiconductor cable, e.g., from two to twelve pounds, this force rating and frequency response is more than adequate to produce repeatable intermittent faults without damaging the CUT. This particular model was chosen because it presented the best compromise between performance requirements, size, and cost. For example, an electrodynamic shaker with same force rating and frequency response would be significantly larger; and an acoustic vibration system would be much more expensive. However, any suitable vibration system could be selected.

The shaker driver 40A receives a control signal 46 from the vibration control program running on the PC, and amplifies and converts the control signal to control the hydraulic shaker actuator piston 60. The hydraulic source 40B provides hydraulic power to the shaker via lines 90 and 92. The flow of hydraulic fluid in lines 90 and 92, regulated by the shaker driver, operates the actuator piston, which determines the characteristics of the oscillation, e.g., force and frequency.

The accelerometer 44 is mounted on the test fixture and produces an electrical signal that is proportional to the acceleration (g) forces that it detects during testing. This signal provides a closed-loop feedback to the vibration controller program running on the PC, which can modify its control signal to maintain the vibration within the test profile parameters. The accelerometer used in the preferred embodiment, a general purpose quartz shear accelerometer available from PCB Piezotronics, Inc., is equipped with its own power source (not shown).

Additionally, the dynamic equipment provides for an optional form of the vibration test, referred to as a flex test.

Research has indicated that the primary source of intermittent faults occurs at the conductor-connector junction. The flex test is designed to place additional strain on this junction to elicit any faults that might not be induced in the vibration-only test. As shown in FIG. 2, a rigid arm 96, referred to as the flex arm, is attached at one end 98 to the hydraulic shaker base 99, and at the other end 100 to the CUT 30.

When the actuating piston and thus the CUT are in motion during a vibration test, the flex arm anchors the CUT at end 100 of the flex arm, preferably at a point on CUT 30 which is 10 or 15 centimeters from connector 102. This is the connector forming one part of the connector-connector junction between connectors 68 and 102. Keeping the cable stationary at the point of attachment 100 places an additional load on the conductor-pin junction in connector 102 and may generate an intermittent fault that would not have otherwise been detected during the vibration-only test. Additionally, the flex arm assists in producing a constant, repeatable, load factor that will generate any hidden intermittent faults without damaging the CUT.

Sometimes cables have only one connector for each end of the cable, as illustrated at the junction of connector 110 and connector 112 in FIG. 1. In other cables, at least one end of the cable may be split to form a plurality of connector points. In FIG. 2, the adaptor cable 66 has been split to accommodate a split CUT 30, so that one junction is formed between adaptor cable connector 114 and CUT connector 116 and another junction is formed between adaptor cable connector 118 and CUT connector 120. Any one of these connector-connector junctions can be chosen as the junction to be tested in the shaker.

The vibration equipment can be controlled by software available from Vibration Test Systems (VTS) as Digital Random Controller DRC-1. The software package comes with an I/O card for transmitting control signals to the shaker on line 46 and receiving feedback from the accelerometer on line 48. Thus, the system uses a closed-loop control scheme to maintain the dynamic stimulation within predetermined limits set by the user in the form of a vibration profile.

Figure 4:
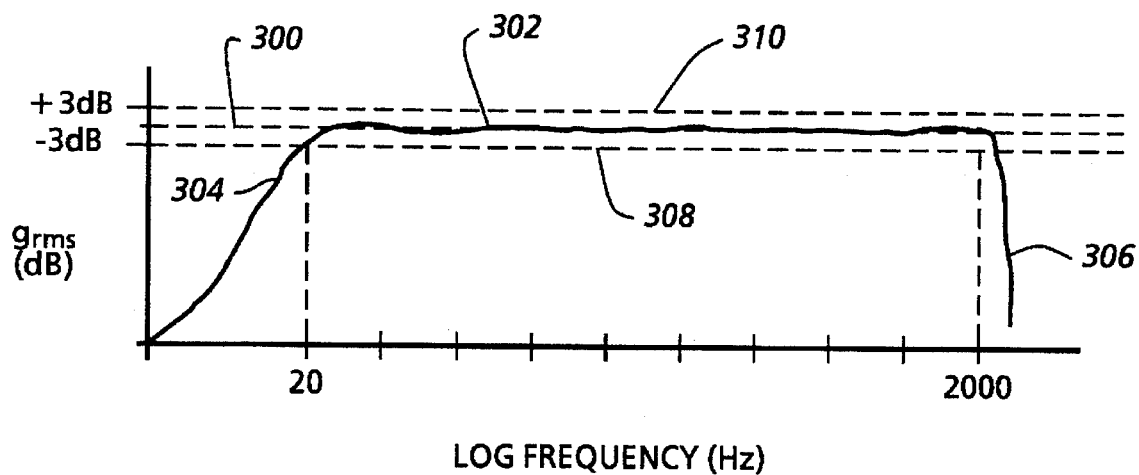
FIG. 4 illustrates a vibration profile providing a plot of g-forces versus frequency of oscillation.
Figure 5:
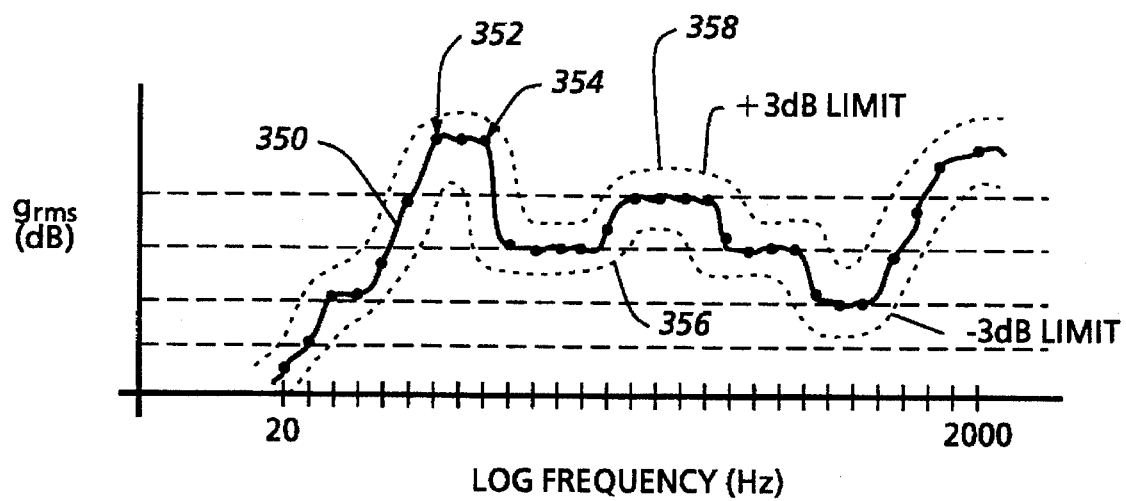
FIG. 5 illustrates a random vibration profile customized for a particular cable type by setting 30 break points to establish the magnitude of the vibrations at various frequencies.

The VTS software allows the user to select from a variety of predetermined vibration profiles or create a specialized profile. A vibration profile refers to the plot of g-forces versus frequency of oscillation as shown in FIGS. 4 and 5. The vibration controller program is capable of controlling oscillation at between 10 Hz and 2000 Hz, and the g value depends on the type of vibration equipment used, e.g., the force rating.

For general cable testing purposes, a random vibration profile ranging from 20 to 2000 Hz which produces an average acceleration of 4 $g_{rms}$ (the root mean square of the g force) is recommended. It was found that acceleration values less than 4 $g_{rms}$ failed to generate consistent test results (i.e., was not reliably inducing the intermittent faults). Furthermore, acceleration values greater than 4 $g_{rms}$ failed to enhance the accuracy or repeatability of the tests, and only served to place the CUT under greater strain, thus increasing the risk of damaging the CUT during the test procedure.

A random test profile is recommended because it was found to produce the most accurate and repeatable intermittent fault detection. A random vibration profile provides acceleration forces at all frequencies over a preselected range or band (e.g, 20 Hz to 2000 Hz as shown in FIGS. 4 and 5), thus increasing the chance that any defective pin or conductor will be in mechanical resonance at some point during the test.

The random profile takes advantage of the fact that all physical structures have at least one characteristic natural frequency at which the structure prefers to vibrate or oscillate. One consequence of this property is that even a small periodic disturbance at that structure's natural frequency may cause significant forced vibrations in the structure.

Each cable may have a different stiffness due to its component materials, the gauge of the conductors, the type of shielding or insulation, or the size of the connector. Accordingly each individual pin or conductor may have a different and distinct natural frequency. Thus, if a defective pin, connector, or conductor is not being subjected to vibration energy at its resonant frequency at the precise moment it is tested by the system, an existing intermittent fault in the system may not be detected simply because it is not being induced.

However, this difficulty is overcome by using a random test profile, which stimulates the workpiece at all of the distinct frequency values over a preselected range simultaneously. Thus, the particular $g_{rms}$ value at any frequency is random, but the average $g_{rms}$ over the entire band is maintained at the preselected value, which can be constant (FIG. 4) or varied (FIG. 5). In this fashion, a lower $g_{rms}$ value over a broad range of frequencies will elicit as many faults as a higher, and potentially damaging, $g_{rms}$ value at a discrete frequency. As illustrated in FIG. 5, the VTS software allows the user to customize the envelope of the random vibration profile for a particular cable type by setting 30 break points, to define a random vibration profile 350. A break point, for example, points 352 and 354, refers to a setting a specific $g_{rms}$ value for a particular frequency. The software then automatically fills in the $g_{rms}$ values for frequencies between the specified break points to create the profile 350. Each customized profile can be saved to disk with a user-defined descriptive filename, perhaps referring to the particular cable type for which the profile is to be used.

Additionally, as shown by dashed lines 308 and 310 in FIG. 4, and 356 and 358 in FIG. 5, the VTS software allows the user to set absolute maximum and minimum values for the $g_{rms}$ value. In the preferred embodiment, the VTS software has been configured with limits at the plus or minus 3 dB $g_{rms}$ value.

Although a random test profile is recommended, it would be possible to use a different controller program to generate a multiplicity of other test formats; for example, a sweeping sine test, or a shock test. A sweeping sine profile involves stimulating the workpiece for a predetermined time at a series of discrete frequencies. The frequency values may begin at a value X, be increased in steps up to a value Y, and then be stepped back to the initial value. Although this variety of testing may be preferred in some applications, our results showed that it was not as well suited as the random test profile to a generic intermittent fault detection scheme. Swept sine vibration did not yield predictable or consistent results, took hours to perform, and was more destructive to the CUT than the random test profile.

It is also possible to use shock testing to agitate the CUT, which involves stimulating the cable over a broad frequency range for a brief time. However, shock testing did not allow time for completing the signal processing portion of the testing, and had other drawbacks similar to those obtained in sine vibration testing. Also, combinations of dynamic stimuli did not produce better results than the random profiles.

In a preferred embodiment of the invention, the constant 4 $g_{rms}$, 20 to 2000 Hz random vibration profile, as shown in FIG. 4, has been made the default vibration profile which is selected automatically each time the vibration controller software is loaded. Once the random vibration test is started, the vibration controller program gradually raises the $g_{rms}$ level to the test level to prevent the CUT from being damaged with a transient.

Returning now to FIG. 1, for a discussion of the signal processing subsystem. The test signal is applied to, and read from, the individual pins of the cable under test (CUT) via computer interface cards. The particular cards or combination of cards chosen must be capable of handling a sufficient number of pins, and must be able to transmit and receive data and control signals quickly enough to implement the program. The preferred embodiment is configured with three CIO-DIO192 cards available from ComputerBoards, Inc. Each card is capable of communicating with 192 pins (96 conductors), enabling the system to handle a total of 576 pins (288 conductors), although the system could be expanded to include any number of cards. The input and output signals for each CIO-DIO192 card are controlled by eight 82C55A-5 PPI chips, with each chip configured into eight-bit ports, each port thus being able to control or monitor eight pins from the CUT. However, any suitable I/O card could be chosen to implement the principles of the invention.

Optionally, each I/O pin of the I/O card can be connected to ground potential through a resistor. This precautionary measure is intended to prevent the voltage of the pins from "floating" or otherwise changing from ground potential in the absence of a true signal carried by the wires and pins of the CUT. Also, the system could include a set of electrostatic discharge (ESD) buffer cards. The ESD buffer cards provide a buffer between the I/O cards and the CUT by absorbing any electrostatic discharge coming from the CUT, and can also boost the output signal from the I/O cards (above the 3 V normal level) to allow the system to drive longer CUTs.

The I/O pins of the cards are numbered consecutively, 1 through 576, and are hardwired to Double "D" (D/D) female connectors, available from The Amp Company. The D/D connectors were chosen because they are widely used in conventional cable testing systems, and should be compatible with many existing adaptor cables. Additionally, the D/D connector provides a damping effect so that vibrations from the CUT are not transmitted directly to computer I/O slots. However, any suitable connector could be implemented.

The cable under test (CUT) is connected to the D/D connectors by an adaptor cable. One end of the adaptor cable is fitted with male D/D connectors (more than one if necessary), and the other end terminates in the appropriate connectors to mate with both (or all) ends of the CUT. Thus, the system is not limited to a CUT having only two connectors. The wiring of the adaptor cable determines which pins of which connector of the CUT are mapped to which pins of the I/O cards via the D/D connectors. For simplicity and consistency, it is recommended that like-numbered pins in the I/O cards, the D/D connectors, the adaptor cable, and the CUT are mapped to one another. However, any pin-mapping scheme could be employed provided that the user is aware of the scheme and can correlate the data provided by the system with the physical structure of the CUT.

The signal processing software was developed specifically for this system in Turbo C++ programming language. The signal processing system is shown generally on the right side 198 of FIG. 3. Step 224 of FIG. 3, the cable setup procedure, is shown in greater detail in FIGS. 6A, 6B.

Figure 6A:
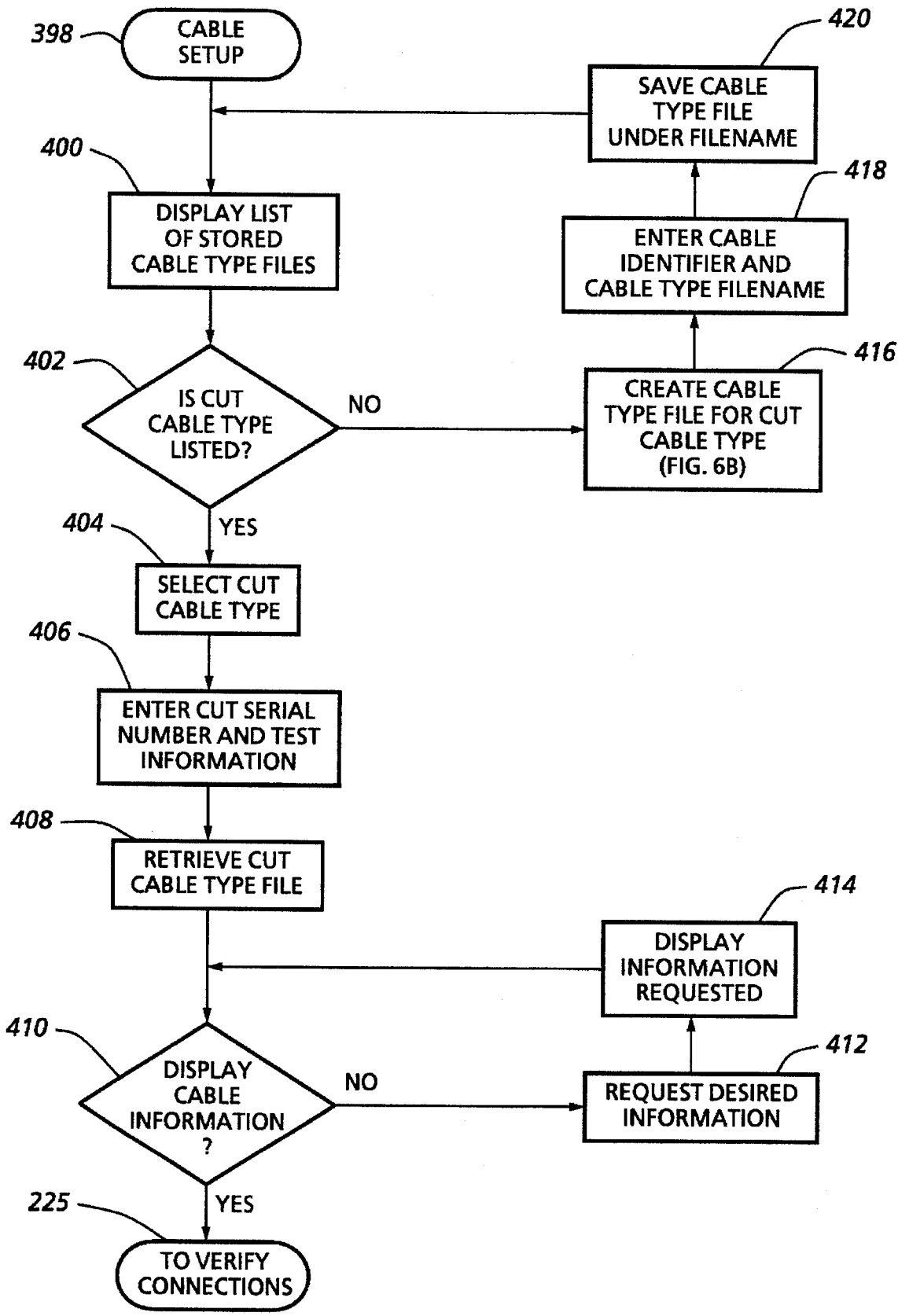
FIGS. 6A and 6B form a flow chart showing the steps of selecting and defining the cable type for the cable under test.

Beginning at entry point 398 of FIG. 6A, the user is first presented 400 with a display of cable types that have been tested previously. Each cable type displayed or listed represents a file that contains wiring information for previously tested known good cables. The files for these files may be stored on the hard drive or on a diskette in the floppy drive. The cable files include information on the cable's connector type, pin configuration, and continuity paths between the pins.

The continuity paths are preferably stored in a two dimensional array of single-bit elements, a "bit map." Each dimension of this square matrix is equivalent to the total number of pins available on the cable. For example, for a cable with N total pins, the continuity array will be an N×N array of bits. The individual elements of the array, denoted by (row, column), indicate whether the pins corresponding to that row index and column index are connected: a "1" (the bit is "set") indicates a connection; a "0" (the bit is "cleared") indicates no connection. By convention, the row index represents the pin into which the test signal is injected, and the column index represents the pin at which the response is measured. For example, a 1 in element (X,Y) indicates that when a signal is input into pin X, that signal should be present at pin Y via a continuity path between those pins.

It is important that all pins are listed both as inputs and outputs. Some cables include direction-sensitive continuity paths. For example, if a conventional diode is connected with its cathode end to pin X and its anode end at pin Y, the continuity path will be present in only one direction, from Y to X. Accordingly, the continuity matrix should contain a 1 in element (Y,X), but not in element (X,Y).

If the appropriate cable type is listed 402, the user selects 404 from the list the cable type corresponding to the current CUT. If the needed cable type is not found, the user selects the option 416 to define a "new" cable type continuity matrix. This procedure is outlined in FIG. 6B, entered at entry point 448. Ideally, when defining or creating the continuity matrix for a new cable-type, the CUT should be a known good cable, so that the continuity information is accurate. If the status of the cable is unknown, the matrix can be generated, printed, and compared with the CUT's wiring schematic provided by the CUT manufacturer.

Figure 6B:
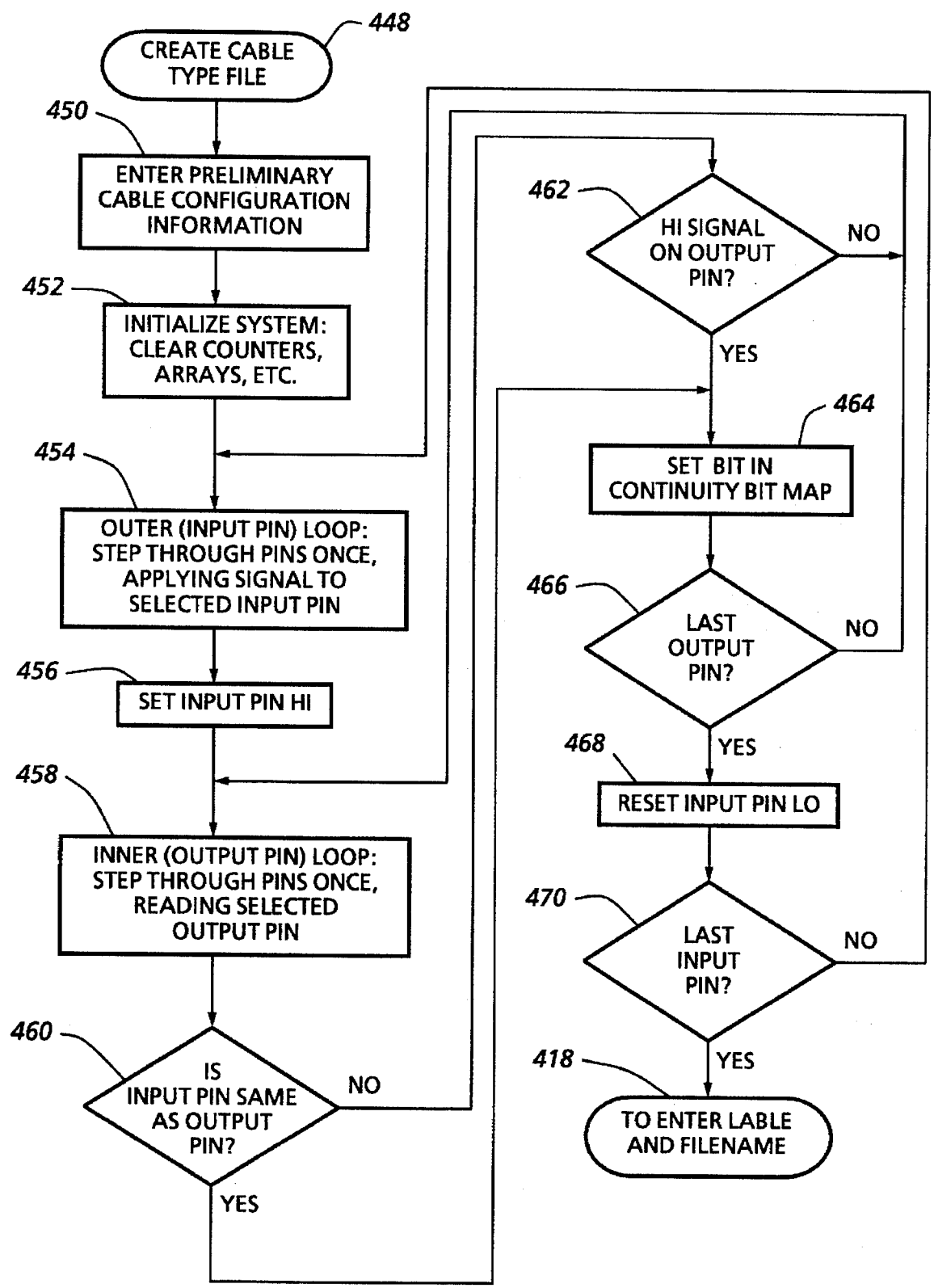

As indicated in FIG. 6B, the user is prompted 450 enter the general information regarding the cable configuration including connector and pin designations and the total number of pins available on the CUT. The system creates 452 an appropriately sized continuity matrix with all of its elements initially cleared (filled with 0s), indicating no continuity between the pins. Additionally, all of the pins are initially driven 452 to logic 0 (LO) to avoid any false signals during the test.

The procedure creates the continuity matrix using a nested loop structure: each iteration of the outer loop 454 selects a different input pin and is equivalent to stepping through the rows of the matrix; and each iteration of the inner loop 458 selects a different output pin and is equivalent to stepping through the columns. During the outer loop, the program places a logic 1 (HI) signal 456 on one pin at a time, the input pin, corresponding to that row of the matrix. During the inner loop, unless 460 the input pin is the same pin as the output pin, the program reads each of the remaining pins in the CUT, the output pin, corresponding to the columns of the matrix. If the signal is detected 462 on the output pin, the program places a 1 in the appropriate element (INPUT-PIN, OUTPUT-PIN) of the matrix 464. If no signal is detected, i.e., no connection between the pins, no entry is required because the matrix has been initialized with 0s and the program immediately returns to the beginning of the inner loop 458 to read the next output pin (and step to the next column).

When all the remaining output pins have been checked 466, the program resets 468 the input pin to logic zero (LO), and if the last input pin has not been reached 470, returns to the beginning of the outer loop 454 to apply a HI signal 456 to the next input pin, and repeat the procedure for the new input pin. When each pin in the CUT has served as an input pin, the matrix will be complete 470.

Returning to FIG. 6A, the user is prompted to provide a filename 418 for the cable file under which it will be saved 420, and also to enter a brief label or descriptive information that will be used to identify the cable type in the cable list. When completed, the cable list is again displayed 400, this time including the cable-type file just created by the user. The user can then select 404 the appropriate cable type from the list and begin the test. The program creates a test-data file for each individual CUT. Consequently, the user is prompted 406 for the serial number of the CUT as well as a short description for the test to be performed, e.g., perhaps the cable is exhibiting a very specific type of fault.

Once this information is entered, the program retrieves 408 the cable information file for the selected cable type. The user is then given the option 410 to display the information recorded in the cable file. For example, by entering 412 a pin number, the program lists 414 all other pins that are connected to the entered pin. If desired, the user could print out a complete list of the continuity paths to be checked against the wiring schematic provided by the cable manufacturer.

Figure 3A:
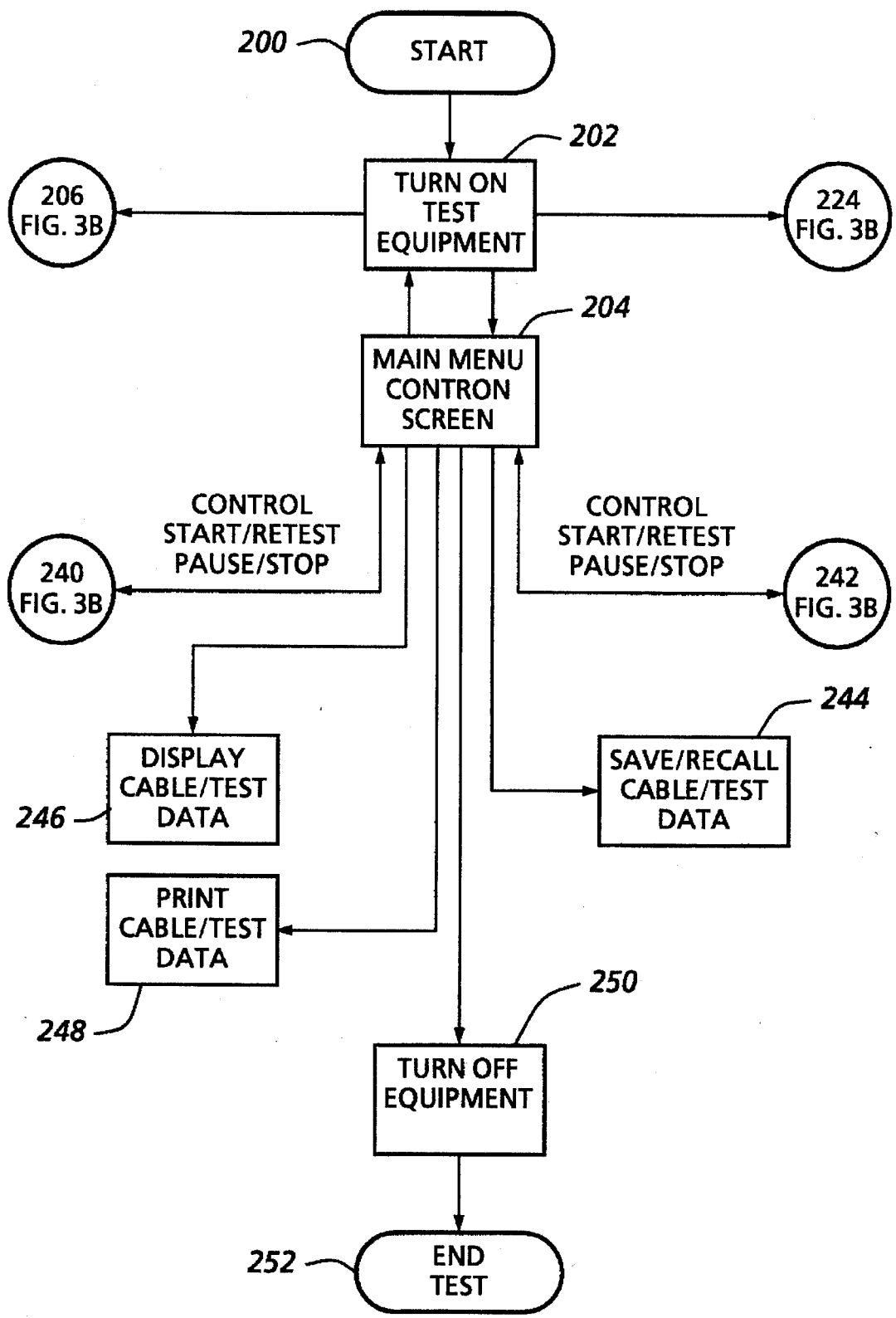
FIGS. 3A and 3B form a flow chart showing the dynamics control steps for inducing intermittent faults in a cable and the signal processing steps for detecting and recording those faults.
Figure 3B:
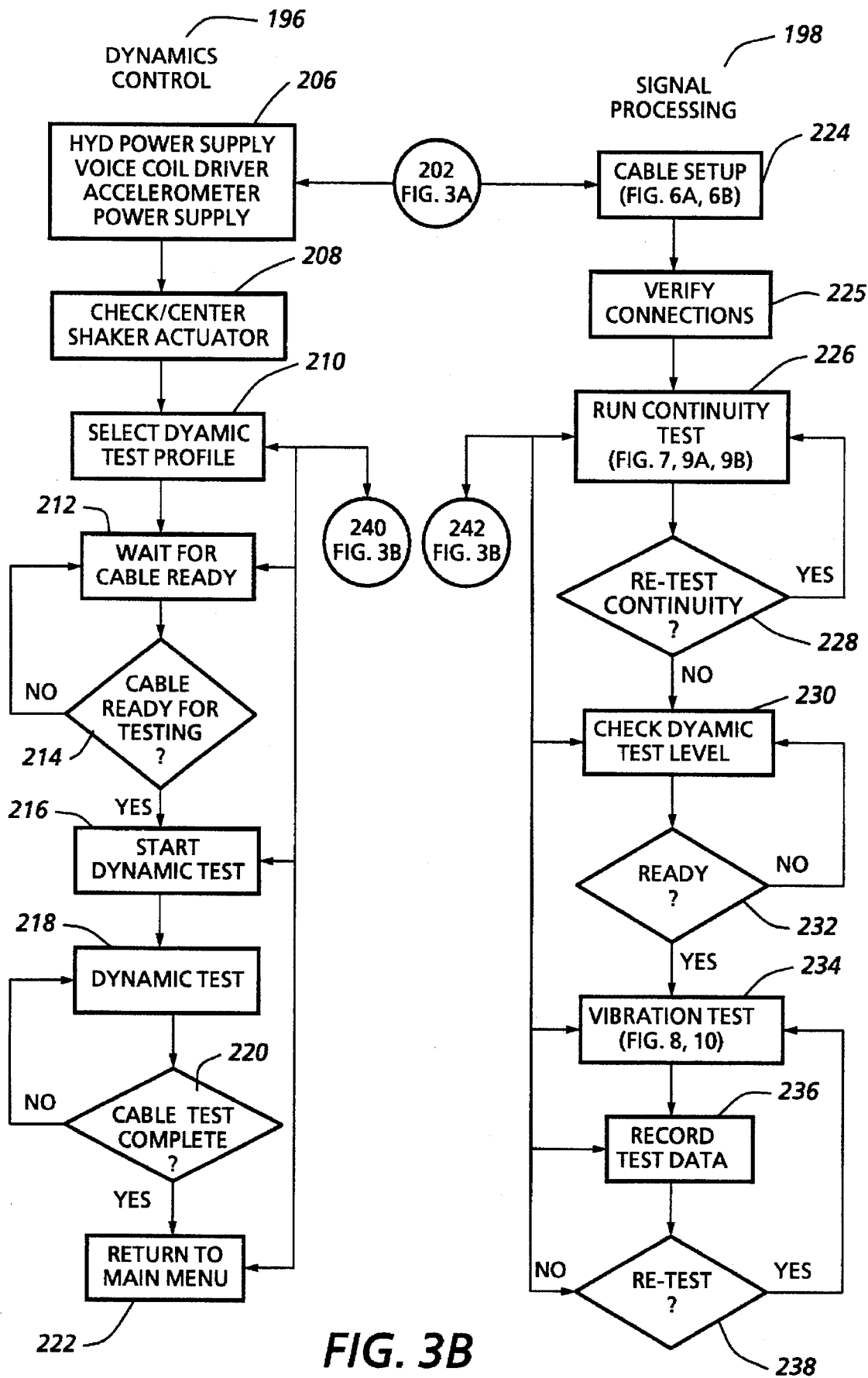

Next, as shown in FIG. 3, the user is directed 225 to verify the cable connections necessary for the test: inserting the adaptor cable into the D/D socket(s), connecting the adaptor cable to the CUT, and fixing the adaptor cable into the test fixture. When all connections are complete, the user may begin the testing sequence. At this point, the dynamic equipment has not been activated.

Figure 7:
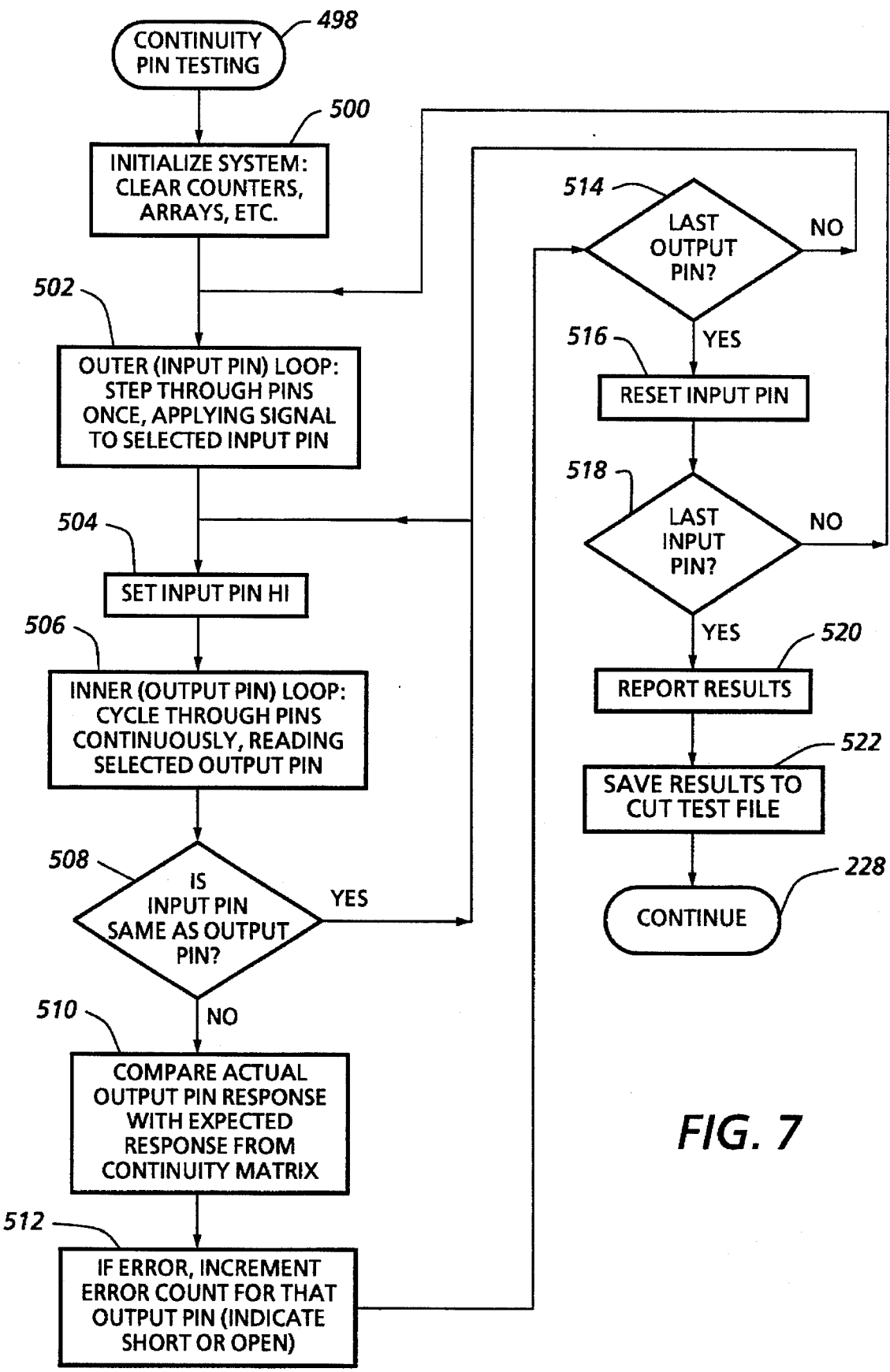
FIG. 7 forms a flow chart showing the steps of checking the continuity between various pins without the vibration stimulus.

First, as shown generally at step 226 of FIG. 3, and specifically beginning at entry point 498 of FIG. 7, the program conducts a continuity test without the dynamic stimulus. This portion of the test is similar to tests performed by conventional cable test systems in that it is designed to check only for "hard" opens or shorts. The continuity test procedure is similar in many respects to the procedure used to acquire a "new" continuity matrix, as in FIG. 6B.

The program first 500 drives all of the pins LO and creates an appropriately sized test matrix (as distinguished from the continuity matrix for the cable) with each element initialized to 0s. Using a nested loop structure, 502 and 506, similar to the process in FIG. 6B, the system acquires a continuity matrix for the CUT and stores it as the test matrix. If desired, the program can continuously reacquire the test matrix until there are no changes in the elements of each successive test matrix (to be sure that the system is not catching an intermittent fault even without the dynamic stimulus being applied).

As each element (INPUT PIN, OUTPUT PIN) of the CUT test matrix is acquired it is compared 510 to the corresponding element of the stored continuity matrix previously created for the CUTs cable type. Any connections shown in the test matrix that are not found in the continuity matrix represent a short circuit, and any missing connections represent an open circuit 512. At the completion of the continuity test 518, the program displays 520 the results, and saves 522 those results to the CUT test file. The faults are reported by pin numbers, connector number, and error type, i.e., open circuit or short circuit. If no faults were recorded, the program issues a statement that the cable has passed the continuity test.

Returning to FIG. 3, the user is then presented with the option 228 of repeating the continuity test, initiating the dynamic test at 230, or returning to the main menu 204. Assuming the user selects the dynamic testing, the program then directs the user to initiate the dynamic stimulus 230. The user would then power up the dynamic equipment and initiate the (VTS) vibration controller program 206. The user selects the vibration profile desired 210, and the vibration controller program gradually brings the shaker up to the desired operating level (304 in FIG. 4) so that the CUT is not damaged by any transients during the start up sequence. The status of the shaker can be monitored on the controller-generated vibration profile display as shown in FIGS. 4 and 5; when the equipment is ready, the user may start the vibration test sequence 216, 234.

Figure 8:
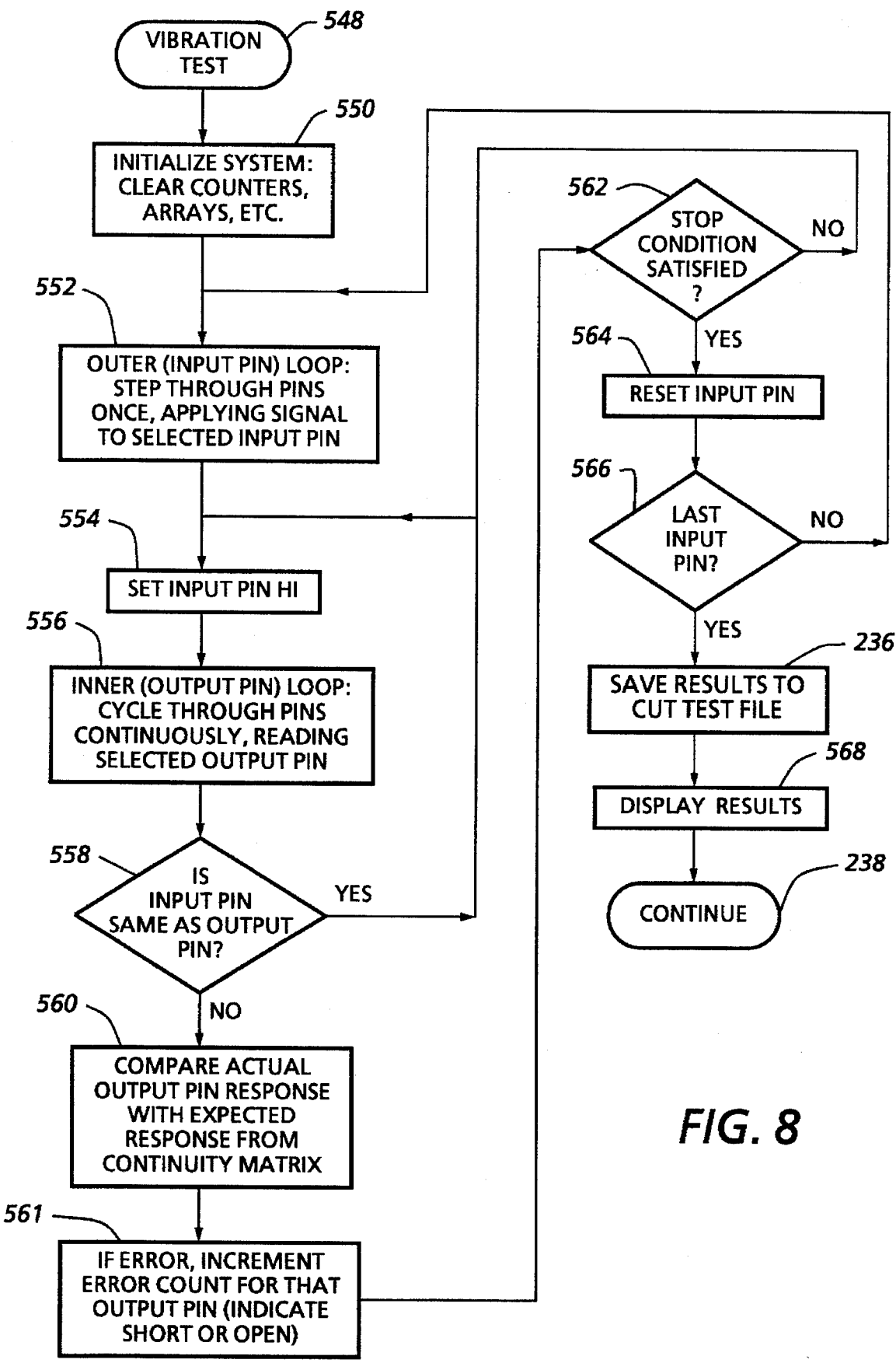
FIG. 8 forms a flow chart showing the steps of checking the continuity between various pins with the vibration stimulus.

As shown in FIG. 8, the vibration testing method contains many similarities to the continuity test procedure of FIG. 7. A nested loop structure, 552 and 556, is used to apply the input signal 554 to the selected input pin, and to compare the measured response for each output pin with the expected response 560. The primary difference in the testing methods is that, for every input pin (selected in the outer loop 552), the response of each output pin (selected by the inner loop 556) is measured multiple times before moving on to the next input pin. In other words, each "row" of the test matrix is acquired repeatedly. As each element in the row is acquired, it is compared 560 with the corresponding element in the continuity matrix and any errors for that bit are recorded in an error array. Each time an error is detected, the error count for that corresponding error type, either open or short, is incremented 561 for that combination of input-pin and output-pin, i.e., corresponding to test matrix element (INPUT PIN, OUTPUT PIN).

The row in the test matrix is continuously acquired until a stop condition is satisfied 562. The stop condition can be any predetermined event; for example, after a time interval (dwell time), when row has been acquired a specified number of times, or if any of the pins reaches a maximum number of errors. The specific stop condition may be determined by the user based on the particular circumstances under which the CUT is being tested.

Alternatively the stop condition can be used to bring about multiple repeated measures of the response of the current output pin before moving on to measure the response of the next output pin selected by the inner loop 556. In other words, rather than repeatedly acquiring the corresponding row of the test matrix until the stop condition occurs, the program can repeatedly acquire the corresponding element of the test matrix until the stop condition is satisfied.

The results of the vibration test are automatically saved to the cable test file 236 and reported 568 to the display. Any intermittent faults detected are listed according to the pin numbers and connector(s) involved, and the type of error (i.e., short or open), and the number of each type of error.

If no errors were recorded, the program issues a statement that the cable has passed the vibration test. Returning to FIG. 3, The next menu 236 allows the user to run another vibration test, start over at the main menu, or exit the program. At the main menu 204 the user can display the cable or test data 246, print a copy of the test results 248, or annotate the test results file 244 with a brief description or comments regarding the results.

At this point, it is preferred that the user run the flex test by repeating the vibration test with the flex arm attached. However, the shaker equipment should be turned off and allowed to come to rest before attempting to connect the flex arm so that the CUT is not damaged during the procedure. As shown in FIG. 2, the flex arm should be placed in position on the shaker base and attached to the CUT at the desired point, e.g., approximately ten centimeters from the CUT connector. The user then merely follows the procedure described above for the vibration-only test. Again, when complete, the test results will be automatically saved to the CUT test file.

The continuity, vibration, and flex tests can be run as many times as desired, and each time the results are appended to the CUT file. At any time the user may enter the main menu 204 and display or print selected portions of the CUT test file for contrast or comparison, or append notes or comments to the file at the conclusion of any test.

Figure 9A:
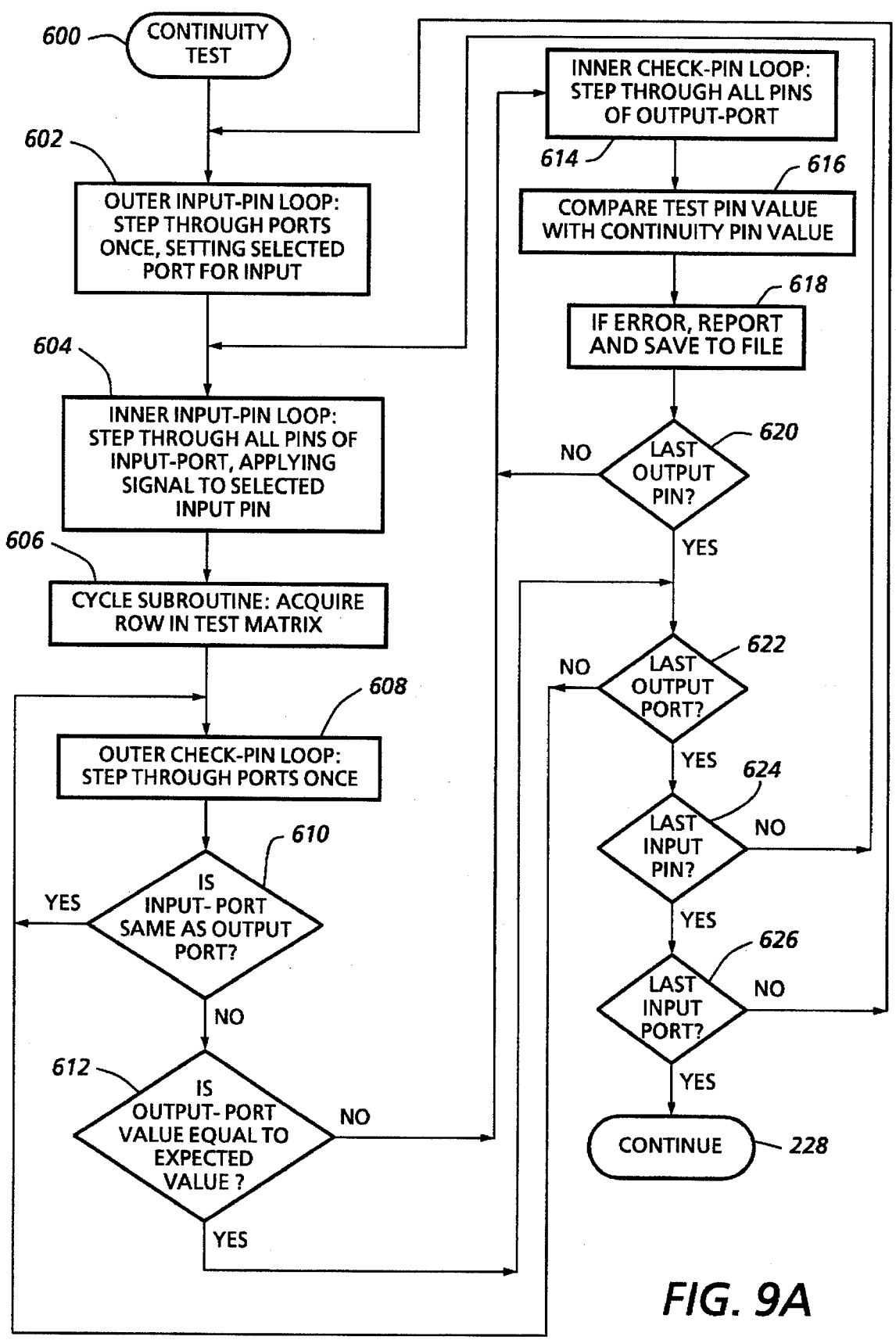
FIGS. 9A and 9B form a flow chart showing the steps which can be used in one embodiment of the cable continuity test.
Figure 9B:
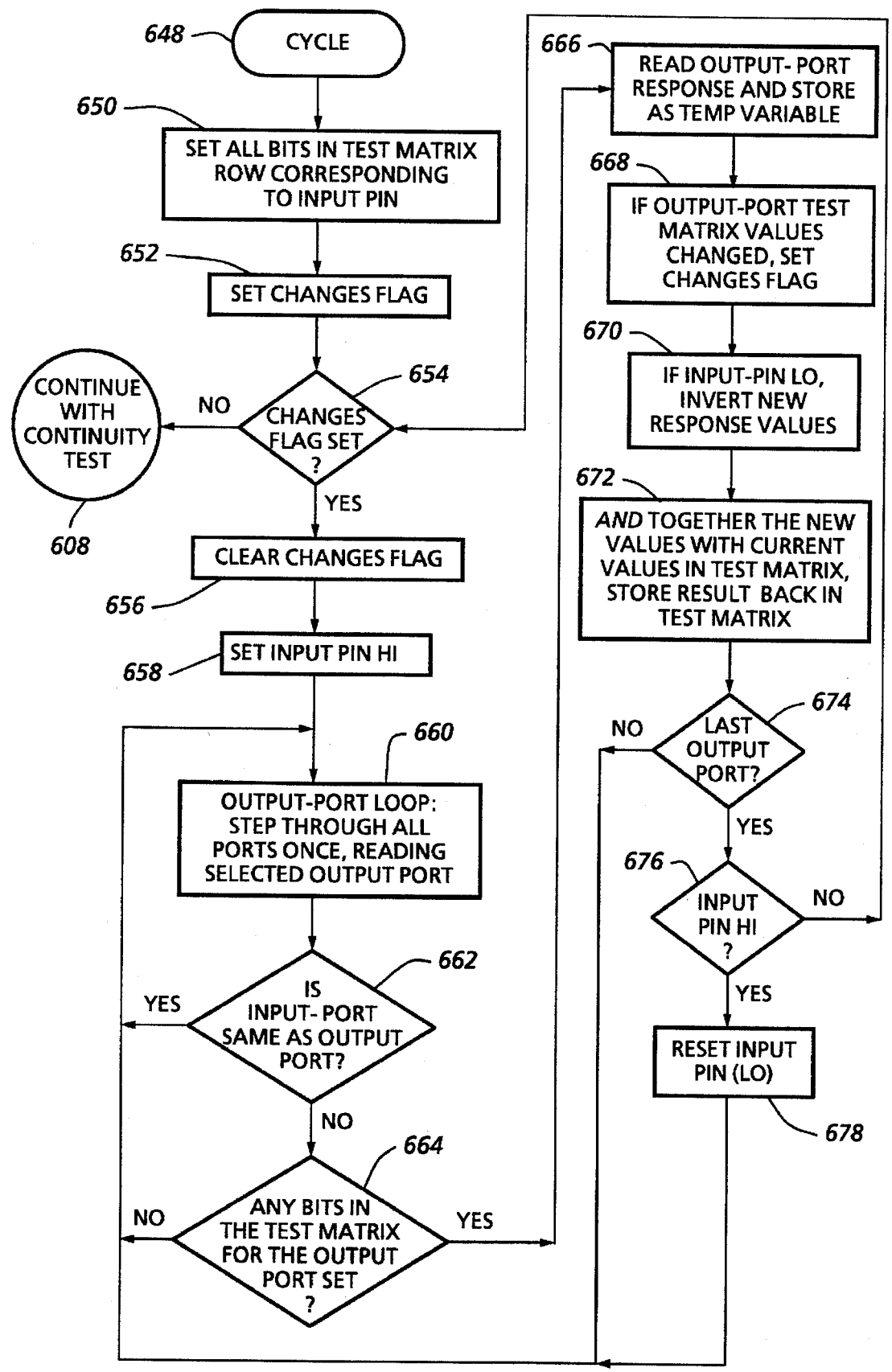

The specific format used to perform the foregoing testing procedures may vary somewhat depending on the particular hardware chosen to implement the principles of the invention. For example, the CIO-DIO192 I/O cards are configured into eight bit ports, meaning that eight pins are written to, or read from, at a time. Additionally, the form of the input signal may be varied according to the specific testing conditions. FIGS. 9A and 9B show a process for performing the continuity check using the I/O cards configured into eight-bit ports, and using a two-stage HI-LO cycle for the input signal.

As shown in FIG. 9A, selecting the input pin (and corresponding row of the test matrix) is itself accomplished by a nested loop format. During each iteration of the outer input-pin loop 602 the program selects one of the eight-bit ports as the input port. Once the input port is selected, the inner input-pin loop 604 selects one pin at a time from that port as the input pin. When the input pin has been determined, program control is turned over to the CYCLE subroutine, which constructs the complete row of the test matrix corresponding to the selected input-pin.

As shown in FIG. 9B, the subroutine CYCLE repeatedly measures the response of the output pins until there are no changes in the corresponding row of the test matrix. Initially, all bits in the appropriate row of the test matrix are set (to 1), indicating a continuity path between the input pins and all of the output pins. Additionally, the CHANGES flag must be initially set (to 1) so the subroutine will enter its main output-port selecting loop 660. With each complete cycle (a HI-LO input cycle as described below) through the subroutine, bits are cleared if it is determined that their corresponding output pins are not connected to the input pin. If a bit is cleared, a CHANGES flag is set to indicate that the program is still eliminating unconnected pins, i.e., the row of the test matrix is still changing. When the subroutine has made a pass through all of the ports without having to clear a bit, the test matrix row is complete and the program continues with the remainder of the continuity test 646.

A complete "cycle" through the subroutine occurs when the response for all output pins has been measured twice: once when the input pin is HI, and once when it is LO. Before entering the loop to step through the output ports, the program drives the input pin HI, and clears the CHANGES flag. First, the program checks the eight-bit word, TEST_PORT, in the test matrix that corresponds to the pins of the current output port to see if any bits are set, thus showing a connection to the input pin. If none of the bits are set then they must have been cleared by the program during a previous cycle, so the program moves on to the next port. In the alternative, if any 1's are found, the program reads the current response of that output port and stores those values in an eight bit word, NEW_PORT.

If the input signal is HI, the program ANDs the current status of the port with the previous status (from the test matrix) and places the result back into the test matrix as the new connection list for those eight pins. Accordingly, the only bits that will remain set after the AND operation are those that contained a 1 in both the test matrix and the new-port values. The procedure when the input signal is LO will be discussed in greater detail later. If the connection list changed from its previous state, the CHANGES flag is set. The program repeats the foregoing procedure until each of the output ports has been read (NEW_PORT) and compared with its previous value (TEST_PORT).

At the completion of the read loop just described, the program checks to see if the input-pin is HI; if so, it is driven LO, and the read loop is restarted. The procedure inside the loop is the same except at step 670. After the current output port values are read in and stored in NEW_PORT, each bit is inverted (1's flipped to 0s and vice versa) before NEW_PORT is ANDed with TEST PORT. The result is that only those pins that were HI when the input pin was HI, and LO when the input pin was LO, will survive the two-step ANDing process. After all ports have been read, program again reaches step 676, and since the input pin is LO the subroutine jumps to step 654. If the program cleared any bits in the test matrix during the previous HI-LO cycle, the CHANGES flag will have been set and another cycle is initiated. Once a complete HI-LO input cycle has been run without changing any bits in the test matrix, the subroutine is terminated and the program continues with the continuity check. In FIG. 9A, the program is comparing the row of the test matrix that it just determined with the corresponding row from the continuity matrix. The program initially compares the two rows eight bits (one port) at a time; if the words are equal, the program steps to the next word. If the two words are unequal, the program initiates a bit-by-bit check to determine the precise source of the error. The results of the comparison are reported in similar fashion to the method described previously. After all of the words and bits of the test matrix row have been checked against the continuity matrix row, the program continues on with the next iteration of the outer input-pin loop and the whole process is repeated. When the entire test matrix has been acquired and checked against the continuity matrix, the program continues on as described previously.

Additionally, the general procedures described for continuity or pin testing can be modified depending on the particular types of faults the user is concerned about. For example, if the user is primarily concerned about intermittent open circuit conditions, an alternative embodiment of the program can be tailored to focus on detecting those errors. For example, FIG. 8 shows a method for performing the vibration pin testing that uses the eight-bit port configured I/O cards, the HI-LO cycled input signal, and that checks only for intermittent open circuit conditions. This embodiment of the program may be able to run significantly more quickly because checking for only open circuits requires that the program read the output response of only those pins that are (should be) connected to the selected input pin (as per the continuity matrix).

Figure 10:
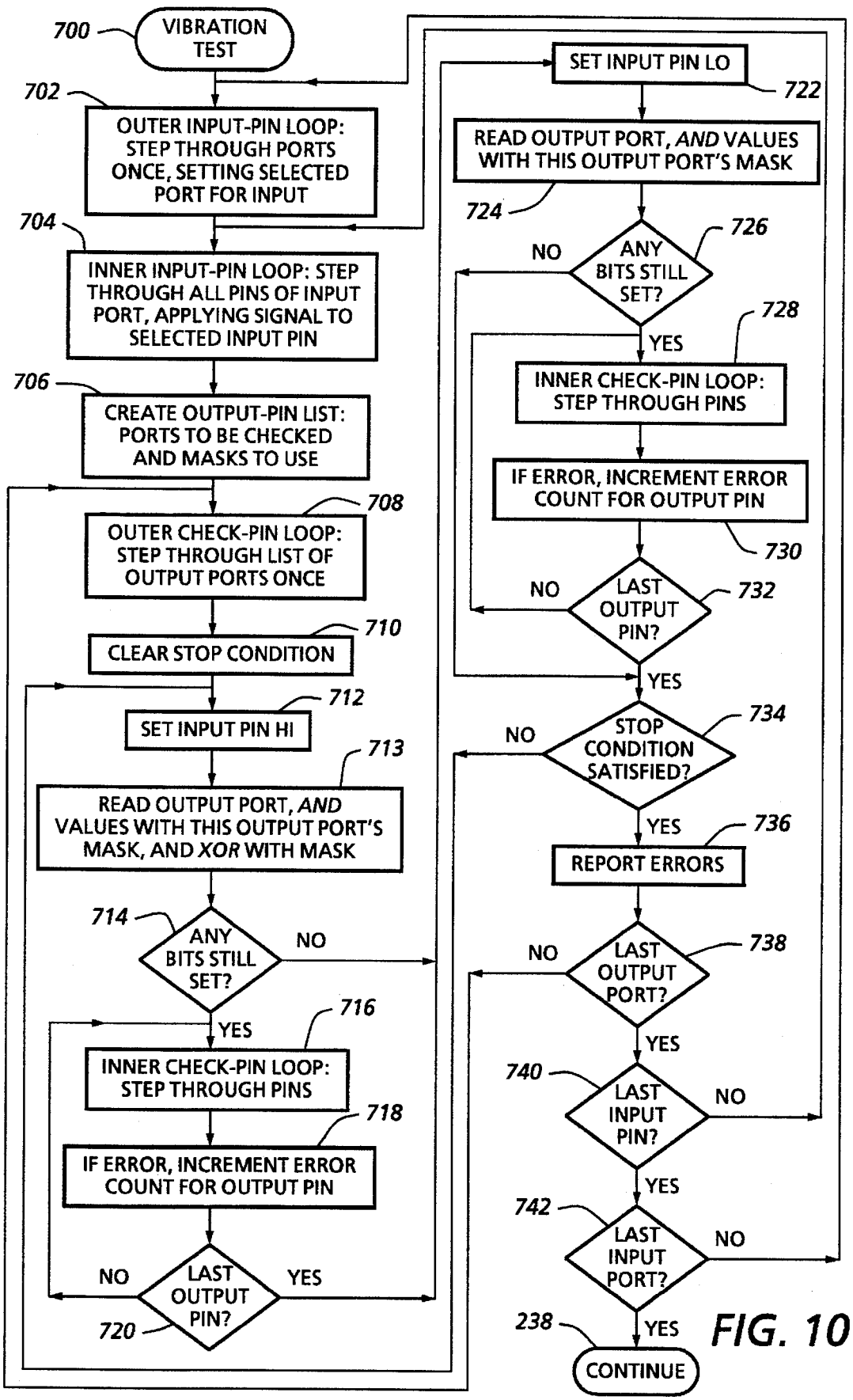
FIG. 10 forms a flow chart showing the steps which can be used in one embodiment of the cable vibration test.

Similar to the continuity test of FIGS. 9A and 9B, the vibration testing method of FIG. 10 uses a nested loop structure to select a given input pin (and thus, a row in the test matrix and the continuity matrix). Next, the program constructs a test list of the output ports which contain pins that should be connected to the selected input pin. The program steps through the appropriate row of the continuity matrix one output port (eight bits) at a time; if any bits are set, the program adds that output port to the list, and stores that eight-bit word as a "mask" that will be used to isolate the desired output pins when that port is read. When the port list (with accompanying masks) is complete, the program enters the outer output-pin loop 708.

During each iteration of the outer output-pin loop, the program repeatedly measures the response of one of the output ports from the test list just constructed and compares that response with the expected response. When a STOP condition is satisfied, the program moves on to measure the response of the next output port on the test list, or, if none remain, then on to the next input pin. As discussed for the vibration testing method of FIG. 8, the STOP condition may be any number of parameters such as elapsed time, pins or ports read, or error counts.

The response of each output port is measured in a two-stage HI-LO input cycle similar to that used for the continuity test of FIGS. 9A and 9B. First the input pin is driven HI, and the response of the output port is read and stored in a temporary variable TEST_PORT. The eight-bit output value is ANDed (AND operation) with the appropriate mask (the corresponding eight bits from the continuity matrix) and placed back in TEST PORT. Next, the TEST_PORT value is XORd (exclusive-OR operation) with the mask and placed back in TEST_PORT. If any bits of TEST PORT remain set, an open circuit error condition is indicated. The only way a bit could remain set after ANDing and XORing with the mask is if (at least one of) the output pins from the test list was LO when the output response was measured.

If an error is detected, the program enters inner check-pin loop, in each pin of the TEST_PORT value is checked: when a bit is found to be set, the error count (open circuit) for that pin is incremented. If no errors are found (no bits are set after the XOR operation), the program continues on to the LO portion of the HI-LO cycle.

The input pin is driven LO, and again the response of the output port is read and stored in TEST_PORT. The output response is ANDed with the output mask, and any bits remaining set indicate and error. Again, the program checks each bit of the port and increments the error count for any bits (pins) remaining set.

The program continues reading the output port using the two-stage HI-LO cycle just described until the STOP condition is satisfied, at which time any errors found are reported to the screen and saved to the test file. Next, the program moves on to the next output port in the test list, or to the next input pin. When each pin of the CUT has served as an input pin, the vibration test is finished and the program continues as described previously.

As well as alternate testing methods, another alternative embodiment of the invention still under development can employ a different hardware configuration for the signal processing subsystem. For example, rather than measuring the response of each pin (or port) serially or sequentially, one embodiment of the invention can use a distributed processing scheme to test groups of pins simultaneously (in parallel) in order to reduce testing time.

A distributed processing scheme requires a plurality of microprocessors, including a main or "master" controller (master) on a master control board, and a series of "slave" processors (slaves), several slave processors per slave board. Each slave processor can run an identical control program and can be responsible for writing to, reading from, and error checking a specified group of pins. All of the slave processors on any single slave board can be wired into a single connector socket, for example, a 256 pin ZIF socket. The pins of the ZIF socket can then be mapped and connected to the pins of the CUT via an adaptor cable, or can be wired into the Double "D" connectors, which in turn are connected to the CUT via an adaptor cable (as discussed previously).

The master controller can coordinate all of the slave processors, sending and receiving control and data signals from each of the slaves. For example, the master can determine which pin will serve as the input pin, and must know what the expected output responses should be on the remaining pins (e.g., from the corresponding row of a continuity matrix for the CUT cable type). The master would then configure the slaves so each slave knows what response to expect on each of its output pins (and in the case of the slave that "owns" the input pin, what signal to place on the pin).

Once configured, the master would send a start command to each of the slaves simultaneously. Each slave processor would then begin running an identical program: reading its output pins, checking the actual response against the expected response to determine opens or shorts, and incrementing the appropriate error counter for that pin and error type. When the test is finished (e.g., a stop condition is satisfied), the master would issue a stop command to all of the slaves simultaneously. Alternatively, if the stop condition were programmed into the slaves, the slaves could notify the master when they have reached that stop condition.

After the output responses have been measured, the master can poll each of the slave processors individually to determine if any errors were detected, and the type and number of errors for each pin. The results of the test can then be printed, or saved to a test file.

The master would receive its own control commands via a data acquisition, control, and analysis program running on the computer, e.g., LabVIEW available from National Instruments. The user can construct a tab-delimited control program to control the specific testing sequence conducted by the master controller. Running such a program would be equivalent to creating a test matrix of output responses.

For example, a typical test sequence might involve directing the master as to which pin is the input pin, followed by a list of the output pins that are connected to that input pin. The master would send the appropriate signals to the slave processors and initiate the test. Once the stop condition is reached and the errors are tallied, the master would be directed to reset itself and prepare for the next input/output pin list.

The above descriptions of the preferred embodiments are not to be taken as limiting the principles of the invention as defined by the appended claims.

We claim:

1. An apparatus for testing a cable, the cable having a first and a second cable connector, each cable connector having a plurality of electrical contacts and having a plurality of electrical paths between the electrical contacts, the apparatus comprising:

A. a test fixture member,
   B. first connector coupling means, carried by the test fixture member, for coupling to the first cable connector and for providing electrical connection to each of the plurality of electrical contacts therein,
   C. second connector coupling means for coupling to the second cable connector and for providing electrical connection to each of the plurality of electrical contacts therein,
   D. means for selecting a first electrical contact from the plurality of electrical contacts in the first cable connector, and for selecting a second electrical contact from the plurality of electrical contacts in one of the first cable connector and the second cable connector, E. vibration means for mechanically vibrating the cable at a plurality of predetermined vibration frequencies simultaneously, F. test means for applying a test signal to the first selected electrical contact, G. means for providing data representative of an expected response signal at the second selected electrical contact, H. signal comparison means for comparing the representative data with a response signal repeatedly measured at the second selected electrical contact to generate data representative of the electrical path between the first and second electrical contact, and I. memory means for storing data representative of the electrical paths between various electrical contacts of the cable connectors.

2. The cable testing apparatus of claim 1, in which: the data representative of an expected response signal is reference data representative of the electrical paths between the plurality of electrical contacts in the first cable connector and the second cable connector for at least one previously tested cable, the reference data being stored in the memory means.

3. The cable testing apparatus of claim 1, wherein the vibration means comprises:

A. agitating means, connected to the test fixture member, for causing relative motion of the test fixture member, B. motion sensing means, for sensing relative motion of the test fixture member, and for generating a signal proportional to the sensed relative motion, and C. agitation controller means, connected to the agitation means and responsive to the motion sensing means, for regulating the relative motion of the test fixture member.

4. The cable testing apparatus of claim 3, further comprising:

means for connecting the agitation means to the cable at a location on the cable between the first cable connector and the second cable connector.

5. An apparatus for testing a cable built from a plurality of wires to determine the condition of the cable, each wire having two ends and having a contact on each of those two ends, the apparatus comprising:

A. a programmed digital computer having a plurality of input/output connection points, B. means for electrically connecting each contact on one end of the cable to a first set of the connection points, and for connecting each contact on the other end of the cable to a second set of the connection points, C. means for mechanically vibrating the cable at a plurality of predetermined vibration frequencies simultaneously, D. means for cyclically selecting a first contact at the sets of connection points and a second contact at the sets of connection points, E. means for applying a test signal to the first selected electrical contact, F. means for repeatedly measuring a response signal at the second selected electrical contact during an interval which is shorter than the period of the lowest frequency mechanical vibration, G. signal comparison means for comparing the test signal to the response signal to indicate the condition of the wire, H. means for causing the cyclic selection of contacts to continue, and I. memory means for storing data representative of the electrical paths between the electrical contacts of the wire.

6. An apparatus according to claim 5, wherein the condition of the wire as indicated by the signal comparison means includes intermittent opens and intermittent shorts.

7. An apparatus for testing a cable built from a plurality of wires to determine the condition of the cable, each wire having two ends and having a contact on each of those two ends, the apparatus comprising:

A. a programmed digital computer having a plurality of input/output connection points, B. connection means for electrically connecting each contact on the cable to a connection point, C. a vibrator for vibrating the cable at a plurality of predetermined vibration frequencies simultaneously, D. cyclic means for repeatedly selecting successive pairs of contacts, E. test means for applying a test signal to one contact in a selected pair, F. measuring means for repeatedly measuring a response signal at the other contact in the selected pair, G. signal comparison means for comparing an expected response signal to the actual response signal to indicate the condition of the wire, and H. memory means for storing data representative of the electrical paths between the electrical contacts of the wires.

8. The apparatus for testing of claim 5, wherein the means for mechanically vibrating comprises:

A. test fixture means for supporting the cable,

B. agitating means, connected to the test fixture means, for causing relative motion of the test fixture means, C. motion sensing means, for sensing relative motion of the test fixture means, and for generating a signal proportional to the sensed relative motion, and D. agitation controller means, connected to the agitation means and responsive to the motion sensing means, for regulating the relative motion of the test fixture means.

9. The apparatus for testing of claim 8, further comprising:

means for connecting the agitation means to the cable at a location on the cable intermediate the ends of the cable.

10. The apparatus for testing of claim 7, wherein the vibrator for vibrating comprises:

A. test fixture means for supporting the cable,

B. agitating means, connected to the test fixture means, for causing relative motion of the test fixture, C. motion sensing means, for sensing relative motion of the test fixture means, and for generating a signal proportional to the sensed relative motion, and D. agitation controller means, connected to the agitation means and responsive to the motion sensing means, for regulating the relative motion of the test fixture means.

11. The apparatus for testing of claim 10, further comprising:

means for connecting the agitation means to the cable at a location on the cable intermediate the ends of the cable.

* * * * *